(12) United States Patent
Oyama et al.

(10) Patent No.: US 12,025,738 B2
(45) Date of Patent: Jul. 2, 2024

(54) RANGING DEVICE AND RANGING MODULE

(71) Applicants: SONY CORPORATION, Tokyo (JP); SONY SEMICONDUCTOR SOLUTIONS CORPORATION, Kanagawa (JP)

(72) Inventors: Yusuke Oyama, Kanagawa (JP); Ken Kikuchi, Tokyo (JP); Hiizu Ohtorii, Kanagawa (JP); Eiji Otani, Kanagawa (JP); Hiroshi Morita, Kanagawa (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 925 days.

(21) Appl. No.: 17/048,203

(22) PCT Filed: Feb. 28, 2019

(86) PCT No.: PCT/JP2019/007834
§ 371 (c)(1),
(2) Date: Oct. 16, 2020

(87) PCT Pub. No.: WO2019/207953
PCT Pub. Date: Oct. 31, 2019

(65) Prior Publication Data
US 2021/0156965 A1     May 27, 2021

(30) Foreign Application Priority Data

Apr. 26, 2018   (JP) ................................ 2018-084613

(51) Int. Cl.
*G01S 7/481* (2006.01)
*G01S 17/08* (2006.01)
(Continued)

(52) U.S. Cl.
CPC ............ *G01S 7/4812* (2013.01); *G01S 17/08* (2013.01); *G02B 3/00* (2013.01); *H01S 5/0239* (2021.01); *G02B 2003/0093* (2013.01)

(58) Field of Classification Search
None
See application file for complete search history.

(56) References Cited

U.S. PATENT DOCUMENTS

2003/0066954 A1   4/2003  Hipp
2012/0248977 A1*  10/2012 Ootorii .................. H01L 24/83
                                                                313/523
(Continued)

FOREIGN PATENT DOCUMENTS

JP    2003-202215    7/2003
JP    2012-209345    10/2012
(Continued)

OTHER PUBLICATIONS

International Search Report prepared by the Japan Patent Office dated Apr. 15, 2019, for International Application No. PCT/JP2019/007834.

*Primary Examiner* — Eric L Bolda
(74) *Attorney, Agent, or Firm* — Sheridan Ross PC

(57) ABSTRACT

The present disclosure relates to a ranging device and a ranging module that allow a light emitting element and a light receiving element to be integrated with a simple structure. A light emitting substrate having a light emitting element is connected to a circuit substrate through first bumps, and a light receiving substrate having a single light emitting element or light emitting elements that are two-dimensionally disposed is connected to the circuit substrate through second bumps. The optical axis of a lens, the optical axis of the light emitting element, and the center axis of the light receiving element are disposed on substantially the (Continued)

same axis. The present technique can be applied to a ranging device that carries out ranging, and so forth.

24 Claims, 14 Drawing Sheets

(51) Int. Cl.
*G02B 3/00* (2006.01)
*H01S 5/0239* (2021.01)

(56) References Cited

U.S. PATENT DOCUMENTS

| | | | |
|---|---|---|---|
| 2013/0207970 A1* | 8/2013 | Shpunt | G06F 3/011 |
| | | | 345/419 |
| 2014/0326892 A1* | 11/2014 | Ootorii | G01T 1/2019 |
| | | | 250/366 |
| 2015/0055117 A1 | 2/2015 | Pennecot et al. | |
| 2015/0219763 A1 | 8/2015 | Nubling | |
| 2017/0170339 A1 | 6/2017 | Ootorii et al. | |
| 2018/0284279 A1* | 10/2018 | Campbell | G01S 7/4861 |
| 2019/0107604 A1* | 4/2019 | Koers | G01S 7/4812 |

FOREIGN PATENT DOCUMENTS

| | | |
|---|---|---|
| JP | 5659903 | 1/2015 |
| JP | 2015-148605 | 8/2015 |
| JP | 2017-003541 | 1/2017 |
| WO | WO 2015/174239 | 11/2015 |

* cited by examiner

RANGING DEVICE AND RANGING MODULE

CROSS REFERENCE TO RELATED APPLICATIONS

This application is a national stage application under 35 U.S.C. 371 and claims the benefit of PCT Application No. PCT/JP2019/007834 having an international filing date of 28 Feb. 2019, which designated the United States, which PCT application claimed the benefit of Japanese Patent Application No. 2018-084613 filed 26 Apr. 2018, the entire disclosures of each of which are incorporated herein by reference.

TECHNICAL FIELD

The present disclosure relates to a ranging device and a ranging module.

BACKGROUND ART

A light emitting element-light receiving element assembly with a structure in which a light source, a light receiving part, and a lens are integrally formed coaxially is described in Japanese Patent No. 5659903, for example.

CITATION LIST

Patent Literature

[PTL 1]
Japanese Patent No. 5659903

SUMMARY

Technical Problems

In the technique disclosed in Japanese Patent No. 5659903, an opening needs to be made in a light receiving part, and manufacturing of the light receiving element is difficult. Furthermore, no description is made about a technique for modularizing plural light emitting elements, and it is impossible to irradiate a wide range with light and carry out ranging.

Therefore, an object of the present disclosure is to provide a ranging device and a ranging module that have a simple structure and in which a light emitting element and a light receiving element are integrated.

Solution to Problems

A ranging device of the present technique includes a lens, a circuit substrate, a light emitting substrate having a light emitting element, and a light receiving substrate having a single light receiving element or light receiving elements that are two-dimensionally disposed. The light emitting substrate is connected to the circuit substrate through first bumps. The light receiving substrate is connected to the circuit substrate through second bumps. The optical axis of the lens, the optical axis of the light emitting element, and the center axis of the light receiving element are disposed on substantially the same axis.

A ranging module of the present technique is a ranging module having the ranging device of the present technique.

In the ranging device and the ranging module of the present technique, the light emitting substrate having the light emitting element is connected to the circuit substrate through the first bumps, and the light receiving substrate having the single light receiving element or the light receiving elements that are two-dimensionally disposed is connected to the circuit substrate through the second bumps. Furthermore, the optical axis of the lens, the optical axis of the light emitting element, and the center axis of the light receiving element are disposed on substantially the same axis.

Advantageous Effect of Invention

According to the present technique, the light emitting element and the light receiving element can be integrated with a simple structure.

Note that the effect described here is not necessarily limited and may be any effect described in the present disclosure.

DESCRIPTION OF EMBODIMENT

Figure 1:
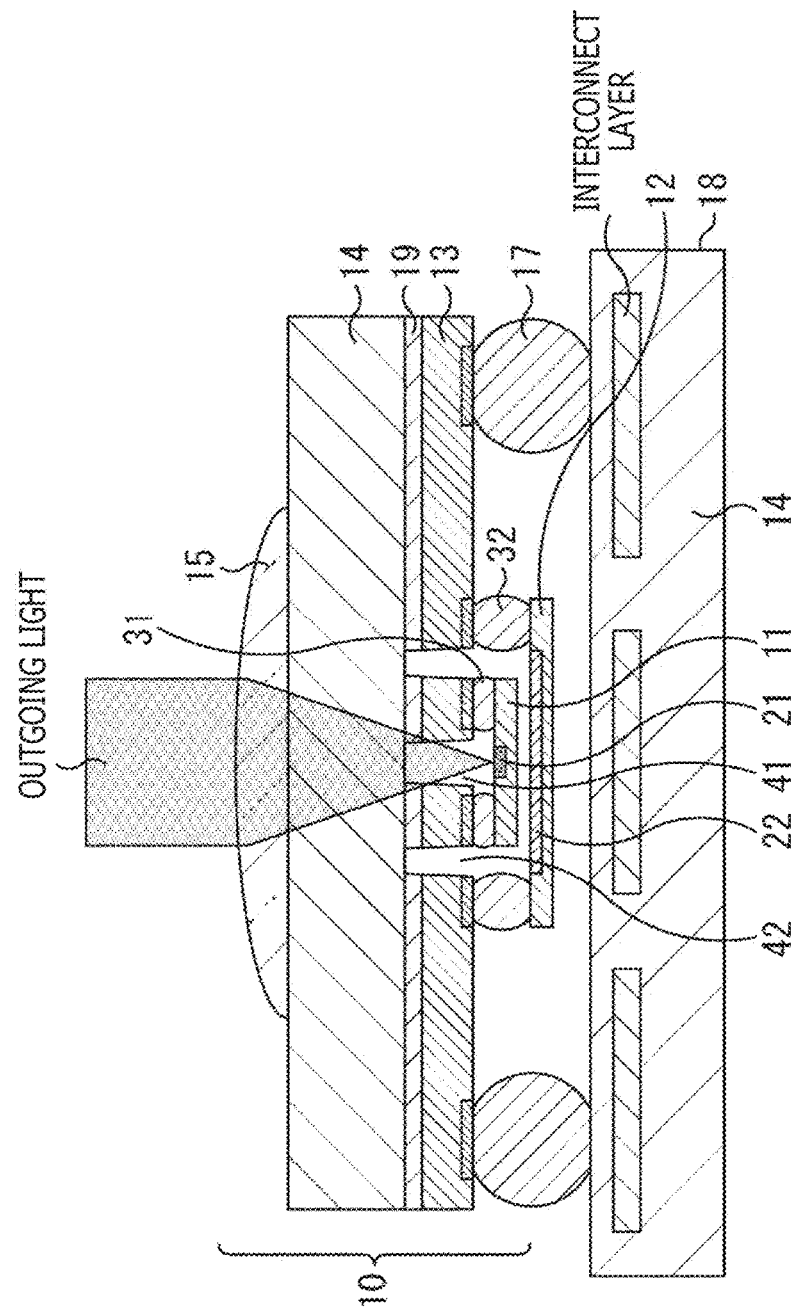
FIG. 1 is a sectional view illustrating a configuration example of a ranging device to which the present technique is applied.

FIG. 1 is a sectional view illustrating a configuration example of a ranging device to which the present technique is applied.

In FIG. 1, a ranging device 10 includes a light emitting substrate 11, a light receiving substrate 12, a circuit substrate 13, a transparent substrate 14, and a lens 15.

The light emitting substrate 11 includes a light emitting element 21. The light emitting element 21 includes a vertical cavity surface emitting laser (VCSEL, Vertical Cavity Surface Emitting LASER), for example.

The light receiving substrate 12 includes a single light receiving element 22 or the light receiving elements 22 that are two-dimensionally disposed. The light receiving element 22 includes a PD (photodiode), APD (avalanche photodiode), or SPAD (single-photon avalanche diode), for example.

The circuit substrate 13 includes a light emission control section (LDD: laser diode driver), a transimpedance amplifier (TIA), a time measuring section (TDC: Time to Digital Converter), a distance calculating section, a serializer, a deserializer, and so forth that are not illustrated in the diagram. The light emission control section controls light emission of the light emitting element 21. The time measuring section measures the period of time from irradiation with light (outgoing light) by the light emitting element 21 to reception of light (return light that returns due to reflection of the irradiation light by an object) by the light receiving element 22. The distance calculating section calculates the distance to the object irradiated with the light on the basis of the period of time measured by the time measuring section.

The transparent substrate (lens surface) 14 is formed to be stacked over the circuit substrate 13. The transparent substrate 14 includes quartz, for example. The transparent substrate 14 is bonded to the circuit substrate 13 by a bonding layer 19 or the like including an adhesive.

The lens 15 is formed on the transparent substrate 14. The lens 15 includes a resin, acryl, quartz, or the like.

The light emitting substrate 11 is connected to the circuit substrate 13 through first bumps (solder bumps) 31. Meanwhile, the light receiving substrate 12 is connected to the circuit substrate 13 through second bumps 32 larger than the first bumps 31.

The present technique is characterized in that an element in which the light emitting element 21, the light receiving element 22, and the lens 15 are stacked and integrated substantially coaxially is used. That is, the circuit substrate 13, the light emitting substrate 11, and the light receiving substrate 12 are disposed in order of the circuit substrate 13, the light emitting substrate 11, and the light receiving substrate 12 with respect to the lens 15. Note that, as long as the coaxiality is kept, the positions of the light emitting substrate 11 and the light receiving substrate 12 may be reversed. The lens 15 is a collimating lens that converts radiated light of the light emitting element 21 (VCSEL) to outgoing light of collimated light. Simultaneously, the lens 15 also functions as a lens that collects return light onto the light receiving element 22 (PD). In the return light, the position of the light receiving element 22 is set in such a manner that the focal point somewhat blurs. The reason for this is because the light emitting element 21 exists on the light reception side of the center of the light receiving element 22 and the central part of the light receiving element 22 does not react with the return light and therefore the light reception efficiency rises when the focal point is intentionally blurred. Alternatively, contrivance is made on the shape of the lens 15. The central part of the lens 15 on which the beam of the light emitting element 21 impinges is designed with priority given to forming a shape that functions as the collimating lens of the outgoing light. The outside of the central part of the lens 15 (peripheral part of the lens 15) is designed with priority given to forming a shape with which the incident return light of collimated light impinges on the light receiving element 22 in a defocused state. One example of specific values of the respective specifications is as follows: chip size: 1.8 mm, lens diameter: $\varphi$1.6 mm, PD chip size: 1.1 mm, thickness: 50 um, light reception diameter of the PD: $\varphi$1 mm, VCSEL chip size: 300 μm, thickness: 30 um, wavelength of light from the VCSEL: 905 nm, exit angle: 25° @full angle, diameter of outgoing collimated light: $\varphi$300 μm, thickness of the lens substrate (transparent substrate 14): 0.8 mm, and so forth.

A point of the structure of the ranging device 10 is that the light emitting element 21 (light emitting substrate 11) (VCSEL chip) and the circuit substrate 13 (circuit layer) exist in front of the light receiving element 22 (PD). The circuit substrate 13 includes Si, for example, and the thickness is 30 um, for example. Because the circuit substrate 13 is very thin, most light can be transmitted through the circuit substrate 13. However, the transmission efficiency lowers considerably. Thus, in order to allow more light to be transmitted, at the part corresponding to the light emitting element 21 and the part corresponding to the light receiving element 22 in the circuit substrate 13, opening parts 41 and 42 are formed, respectively.

Furthermore, the light emitting substrate 11 (VCSEL chip) includes GaAs, for example. Also regarding the light emitting substrate 11, several tens of percentages of light are transmitted in the case of only the material of the light emitting substrate 11 itself. However, the transmittance of the light transmitted through the light emitting substrate 11 lowers due to an electrode metal used for pattern interconnects, and so forth. In this case, the relevant part of the PD (including APD and SPAD) as the light receiving element 22 is covered by a PD cathode ring or the like and is turned to a non-detection part. This can reduce the parasitic capacitance although the light reception area of the PD as the light receiving element 22 decreases. The ranging device 10 may be allowed to have a structure more advantageous for enhancement in the speed through implementing such contrivance.

The light emitting element 21 may include an LD of a general high-output-power edge emitting type. However, a VCSEL of a surface emitting type is applied to the light emitting element 21 in the case in which it is difficult to dispose the LD of the edge emitting type in view of the structure. A front-surface emitting type is applied to the VCSEL. To the PD as the light receiving element 22, a front-surface receiving type may be applied or a back-surface receiving type may be applied. Furthermore, in the future, a configuration in which the PD and the circuit substrate 13 are integrated may be employed.

Moreover, as the kind of PD, a standard PD may be applied or a highly-sensitive APD (avalanche photodiode) or SPAD (single-photon avalanche diode) may be applied. In this case, a high voltage at a level of 50 to 100 V needs to be applied to the cathode of the APD. For this purpose, a structure is employed in which the cathode of the APD is directly coupled to a solder bump 17 of the ranging device 10 and the high voltage is directly guided from a substrate outside the ranging device 10.

Furthermore, in this case, a current control circuit (large-current cutoff circuit, circuit that causes a voltage drop at the time of large current, or the like) is disposed on the cathode interconnect of the APD. The purpose of this is to prevent the occurrence of the situation in which, in the case in which strong light is applied to the APD, a large current flows on the anode side of the APD and a trouble occurs in the TIA which the circuit substrate 13 has. Such a current control circuit may be embedded in the ranging device 10 as a single chip, be mixed into the APD, or be fabricated into the same layer as the circuit substrate 13 (LDD/TIA or the like). In the case of disposing plural ranging devices 10, the current control circuit may be disposed adjacent to each ranging device 10 as an SMT (Surface mount technology) chip.

The ranging device 10 configured in the above-described manner is mounted on a flexible substrate 18, for example, to configure a ranging module. The mounting of the ranging device 10 on the flexible substrate 18 is carried out by electrically connecting the circuit substrate 13 of the ranging device 10 and the flexible substrate 18 by the solder bumps 17, for example.

Figure 2:
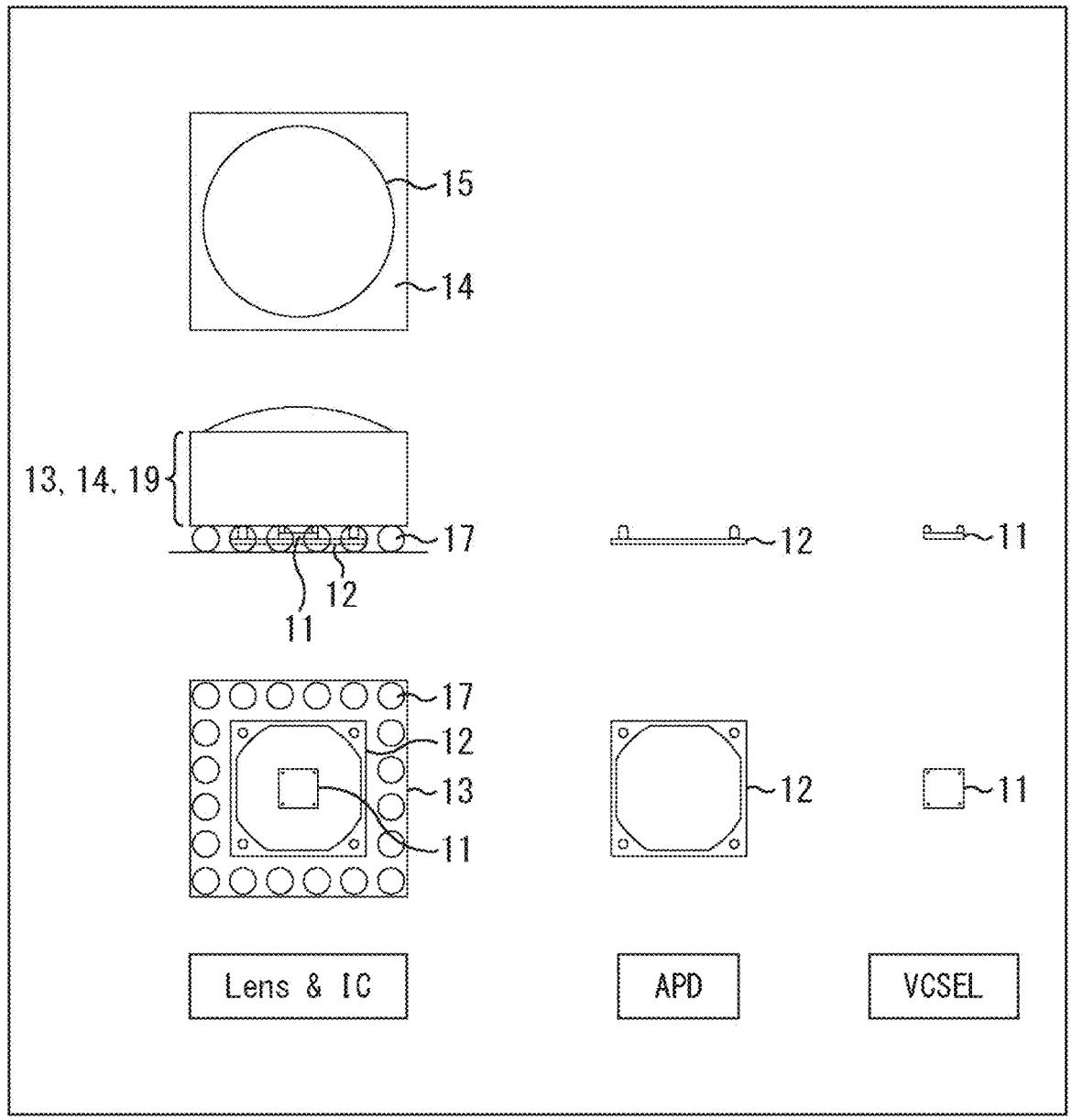
FIG. 2 is an appearance diagram illustrating an example of constituent parts of the ranging device to which the present technique is applied.

FIG. 2 is an appearance diagram illustrating an example of constituent parts of the ranging device 10 to which the present technique is applied.

FIG. 2 illustrates a bottom view, a front view, and a plan view of the ranging device 10, a plan view and a front view of the light receiving substrate 12, and a plan view and a front view of the light emitting substrate 11. In the light emitting substrate 11 (VCSEL), the light receiving substrate 12 (APD), and the circuit substrate 13 over which the transparent substrate 14 on which the lens 15 is formed is stacked (Lens & IC) in FIG. 2, the VCSEL has the smallest area in plan view. In plan view, the APD has a larger area than the VCSEL. That is, the light reception area of the APD is larger than the light emission area of the VCSEL. Due to this, light that has been emitted from the VCSEL and been reflected at a target object is kept from being all blocked by the VCSEL. This allows the APD to receive the reflected light.

Moreover, the light collection area of the lens 15 is larger than the light reception area of the APD. This can efficiently collect the reflected light onto the APD.

Figure 3:
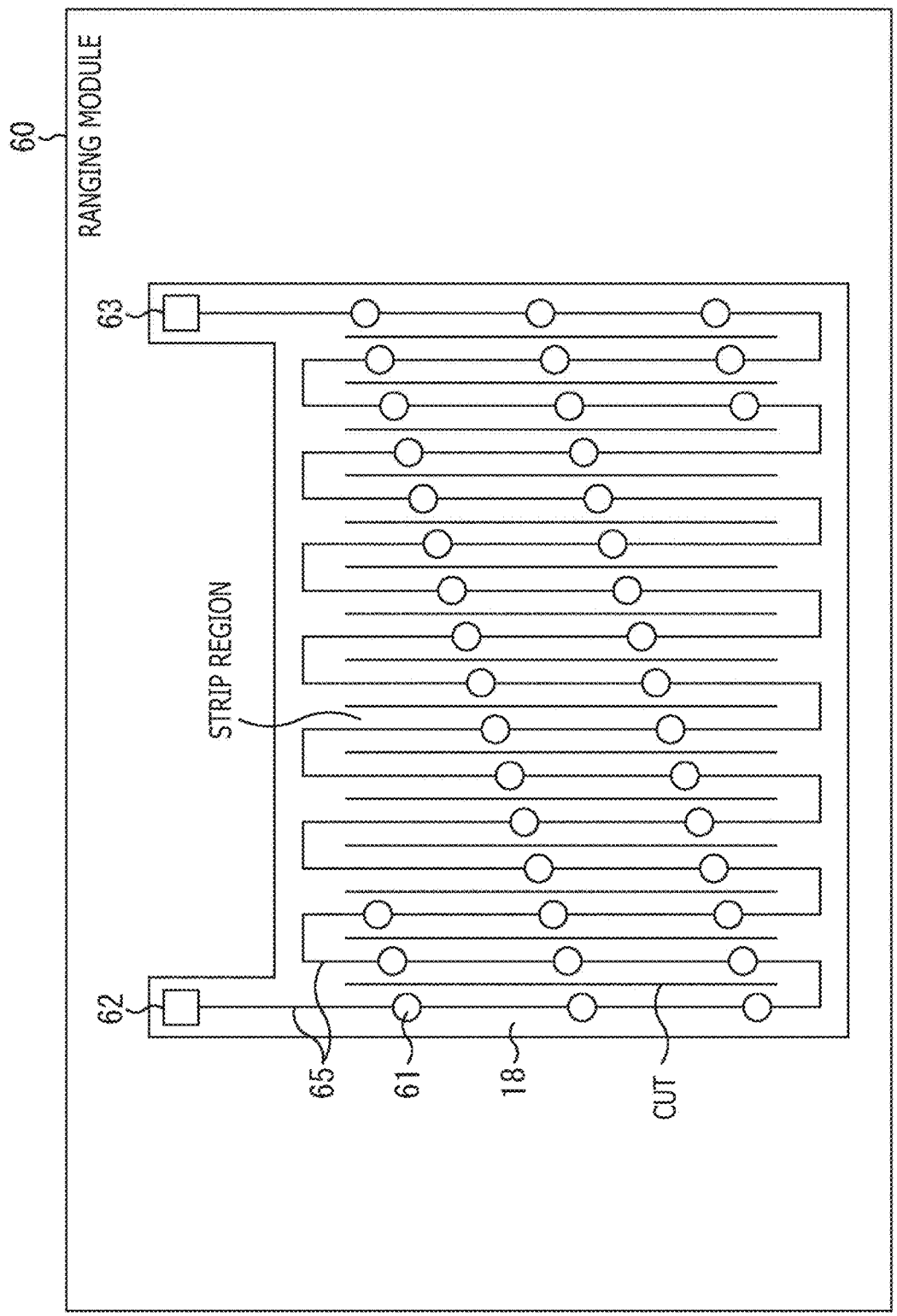
FIG. 3 is a plan view illustrating a configuration example of a ranging module to which the present technique is applied.

FIG. 3 is a plan view illustrating a configuration example of the ranging module to which the present technique is applied.

In FIG. 3, a ranging module 60 has plural ranging elements 61, a control element 62, an interface element 63, and so forth. The plural ranging elements 61 are configured similarly to the ranging device 10 in FIG. 1 and are connected in series on one row in a form in which the control element 62 (Control-IC) is connected to the starting point and the interface element 63 (TransferJet-IC) is connected to the ending point. The ranging elements 61 are disposed on the flexible substrate 18 having cuts at predetermined intervals. The ranging module 60 has the flexible substrate 18 having the cuts at the predetermined intervals, and one or more ranging elements 61 are disposed in one of plural longitudinally-long parts formed by the cuts of the flexible substrate 18. In FIG. 3, in one longitudinally-long part, two or three ranging elements 61 are disposed to line up in the longitudinal direction. Moreover, in FIG. 3, the ranging elements 61 are disposed on the flexible substrate 18 in such a manner that the positions of the ranging elements 61 in the longitudinal direction with respect to the flexible substrate 18 are shifted by a predetermined amount. The control element 62 and the interface element 63 are disposed at the upper left and the upper right of the flexible substrate 18, respectively. Specifically, in FIG. 3, the flexible substrate 18 has a shape in which, at the upper left and the upper right of a rectangle (hereinafter, referred to also as a main rectangle), rectangles (hereinafter, referred to also as ear rectangles) smaller than the rectangle are disposed. In the main rectangle, the plural cuts in the longitudinal (vertical) direction are disposed at predetermined intervals in the lateral (horizontal) direction. Due to this, regions with a longitudinally-long strip shape (hereinafter, referred to also as strip regions) are formed between the cuts. In the flexible substrate 18, two or three ranging elements 61 are disposed to line up in the longitudinal direction in each strip region in such a manner that the positions of the ranging elements 61 in the longitudinal direction are shifted by the predetermined amount. Furthermore, the control element 62 is disposed in the ear rectangle at the upper left of the flexible substrate 18, and the interface element 63 is disposed in the ear rectangle at the upper right. A connecting line 65 connects the plural ranging elements 61, the control element 62, and the interface element 63 in series. The connecting line 65 is based on a clock pair differential line and a data pair differential line and includes other several kinds of control lines. As the power supply system, for example, Vcc of 3.3 V, GND, a high voltage suitable for the APD as the light receiving element 22, and so forth are assumed. The control element 62 transmits a trigger signal at equal intervals when becoming an activated state. For example, in the case in which the operation time of light emission of the ranging element 61→light reception→time difference-distance conversion-→data writing is shorter than 0.5 mSec, the control element 62 transmits the trigger signal at 0.5 mSec or longer. In response to this, the subsequent ranging elements 61 sequentially start ranging operation in a bucket brigade state and transmit packet data as ranging data obtained by the ranging operation. The interface element 63 at the ending point receives the packet data from the ranging element 61 and transmits the packet data to a main unit separately disposed. More specifically, the interface element 63 transmits the packet data as serial data received from the ranging element 61 to a CPU of the main unit. The transmission may be either wired transmission or wireless transmission. However, wireless transmission is desirable. As the standard of wireless transmission, for example, TransferJet (registered trademark) and so forth are cited.

Figure 4:
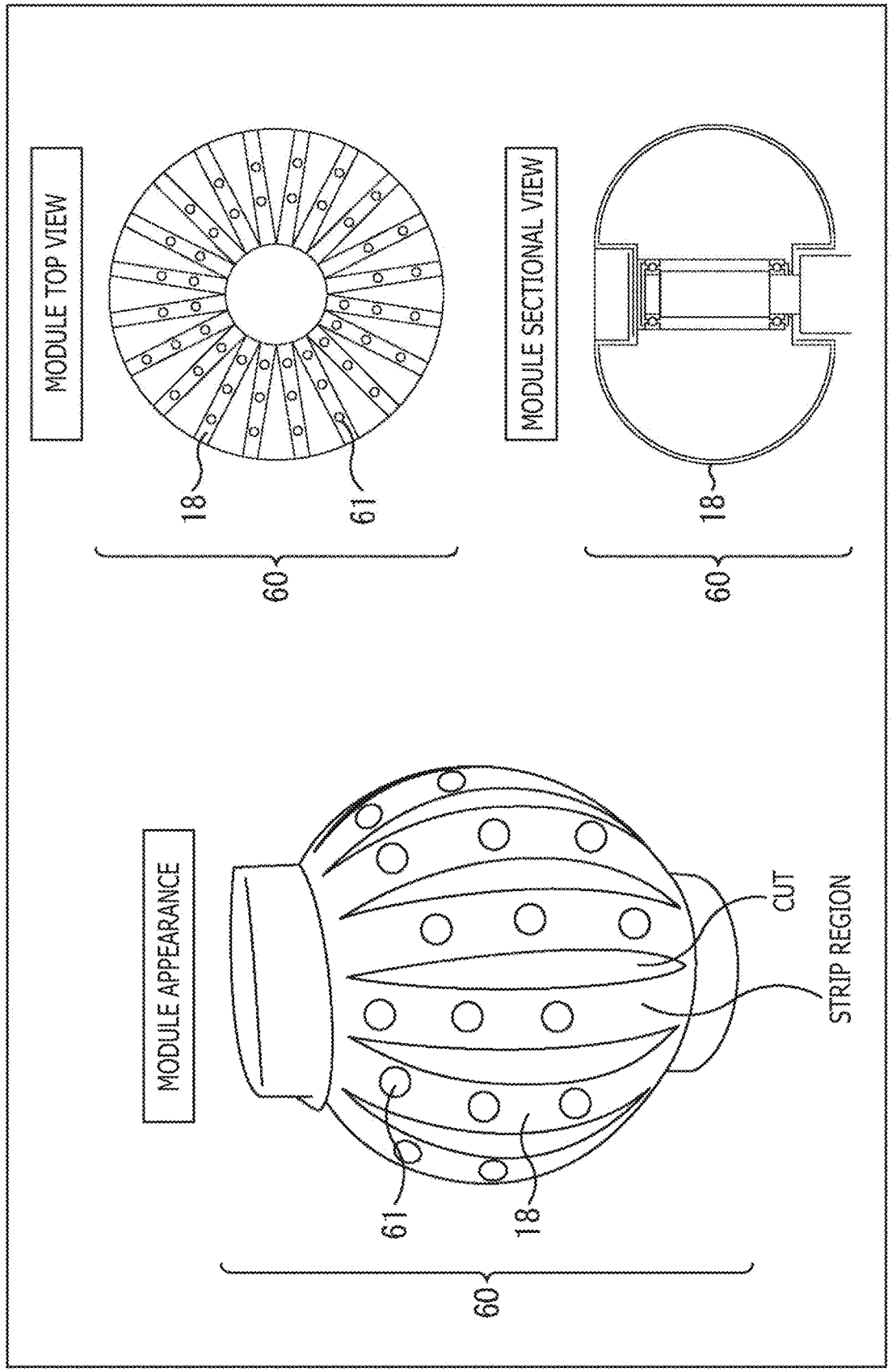
FIG. 4 is a diagram illustrating an assembly example of the ranging module to which the present technique is applied.

FIG. 4 is a diagram illustrating an assembly example of the ranging module to which the present technique is applied.

As the number of layers of the flexible substrate 18 in the present technique, three or four layers are assumed. Because the respective ranging elements 61 are connected in series, the flexible substrate 18 may have an elongated one straight line shape (longitudinally-long strip shape). However, in consideration of cost reduction of the flexible substrate configuring the ranging module 60, it is more preferable that many product substrates can be taken from a mother substrate that is as square as possible. Thus, a spiral type, a zigzag type, a lantern type, and so forth are preferable as the substrate shape of the flexible substrate configuring the ranging module 60. Alternatively, a shape of a one straight line type, a radial type, or the like may be employed. In FIG. 4, a configuration example of a lantern type is illustrated.

In FIG. 4, the strip regions of the flexible substrate 18 on which the plural ranging elements 61 are disposed to line up in the longitudinal direction with respect to the cuts as illustrated in FIG. 3 are disposed to configure longitude lines (meridians) of a sphere (globe), and thereby the ranging module 60 is formed into a lantern-like shape that is a spherical shape that somewhat collapses vertically. Specifically, in FIG. 4, the flexible substrate 18 in FIG. 3 is disposed in such a manner as to be what is called wound around a base component with the spherical shape that somewhat collapses vertically (substantially spherical shape), and thereby the ranging module 60 with the substantially spherical shape in which the strip regions of the flexible substrate 18 configure longitude lines is configured. The ranging elements 61 configured similarly to the ranging device 10 are disposed on the flexible substrate 18 in a form in which the lens 15 is oriented outward. Note that, in FIG. 4, diagrammatic representation of the connecting line 65 is omitted in order to avoid complexity of the diagram.

Moreover, in terms of power feed, a voltage drop in a power feed line and so forth are of concern in the spiral type in which a small width endlessly continues, for example. Specifically, a sufficient voltage can be applied to both end parts. However, at the central part, naturally the distance from the power feed part is long, and therefore voltage lowering due to the substrate interconnect resistance becomes a problem. In this case, the zigzag type, the lantern type, and so forth in which power feed is possible from each U-turn part of the series interconnect are desirable.

In assembling of the ranging module 60, the flexible substrate 18 on which the ranging elements 61 are disposed is stuck and fixed to the base component having a curved surface of a protrusion shape, spherical shape, or the like. Positioning is carried out by fitting positioning through making holes in the flexible substrate 18 and disposing protrusions or the like on the base component, for example. Besides, holes may be made in both the flexible substrate 18 and the base component, and positioning fixing with use of pins for positioning may be carried out. This can orient the ranging element 61 (optical axis of the lens 15 thereof) in the direction perpendicular to the curved surface, and ranging of the corresponding direction is allowed regarding each ranging element 61. Major specifications of the ranging module 60, such as the ranging angle and the resolution, can be freely set by varying the mounting positions, pitch, and so forth of the ranging elements 61. Setting in which ranging is carried out with a high resolution regarding a certain direction and is carried out with a low resolution regarding a certain direction is also possible.

However, for example, in the case of attempting to allow the ranging module 60 to have as high a resolution as a resolution of 1° or smaller, the ranging elements 61 are needed correspondingly. Therefore, a large number of ranging elements 61 are needed. For example, in the case of carrying out ranging in omnidirectional orientations with a resolution of 0.1° regarding the longitudinal and lateral directions, approximately 6.5 million ranging elements 61 are needed (=3600×1800).

In the case in which such a high resolution is needed, a structure that rotates the base component is effective for cost reduction. For example, when the ranging elements 61 are mounted every 10° in the H (horizontal) direction (36 lines) and every 3.6° in the V (Vertical) direction (50 elements) and rotational scanning is caused to be carried out with the mounting positions being offset by 0.1° each, the resolution of 0.1° similar to the above can be implemented with as small a number of ranging elements 61 as 1800 elements (=36×50). For your reference, at this time, ranging is carried out 3600 times (=360°/0.1°) per one rotation. Assuming that 0.5 mSec is needed per one measurement, the above-described measurement is allowed when the base component is rotated with 1.8 Sec (=0.5 mSec×3600 times) per one rotation.

Alternatively, a form in which the flexible substrate 18 is mounted on a base component with an umbrella skeleton shape is also conceivable. For example, the ranging elements 61 are mounted every 90° in the H direction (four lines) and every 6° in the V direction (30 elements), and rotational scanning is caused to be carried out with the mounting positions being offset by 1.5° each. At this time, when the base component is rotated with the angle of the skeleton being changed by 0.1° for each one rotation, the number of ranging elements 61 can be reduced to 120 elements (4×30). For your reference, at this time, ranging is carried out 3600 times per one rotation. Assuming that 0.5 mSec is needed per one measurement, it suffices that the base component is rotated with 1.8 Sec per one rotation, and the omnidirectional scan is completed through 15 rotations.

Figure 5:
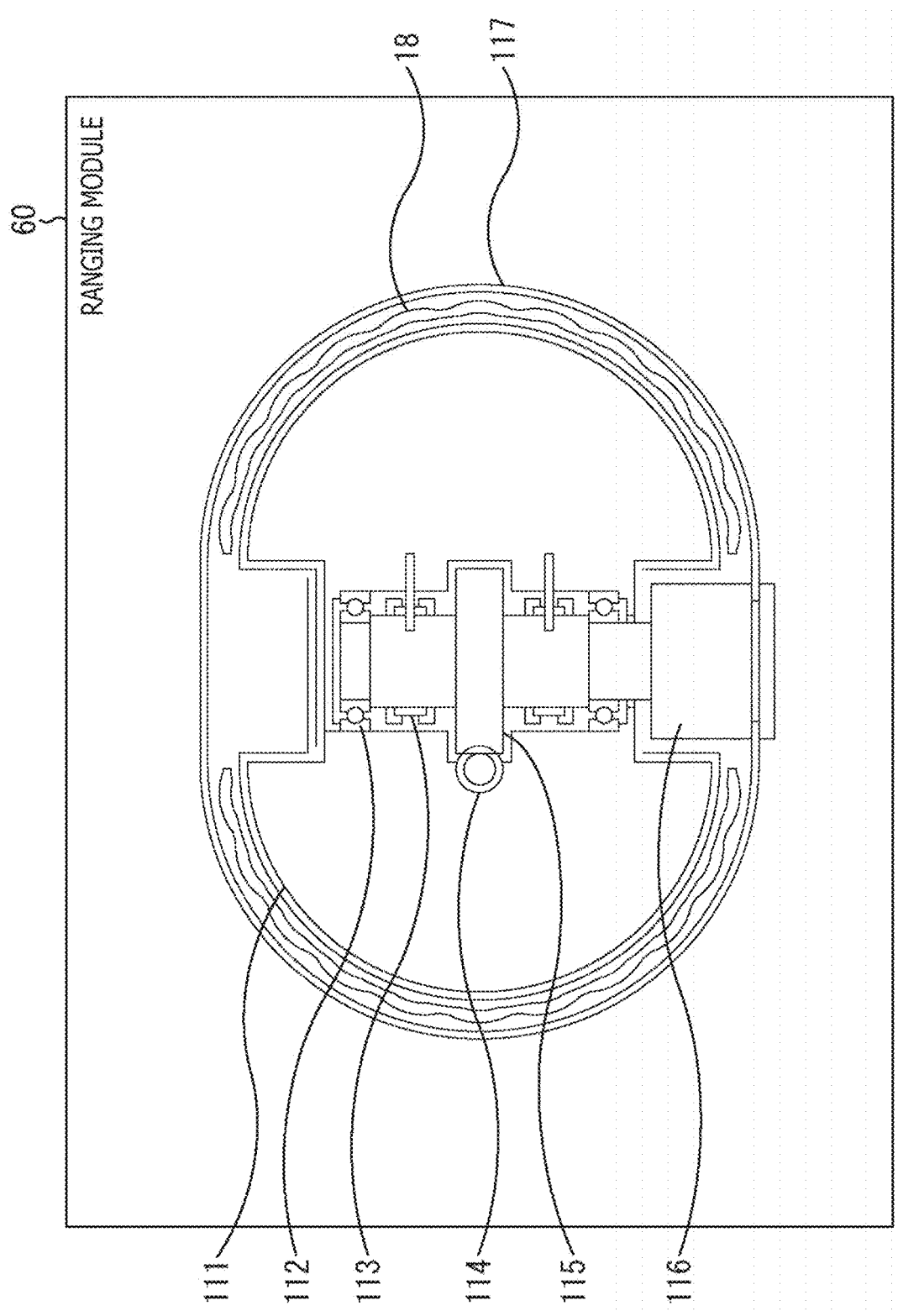
FIG. 5 is a sectional view illustrating a configuration example of the ranging module to which the present technique is applied.

FIG. 5 is a sectional view illustrating a configuration example of the ranging module to which the present technique is applied.

In FIG. 5, the ranging module 60 includes a flexible base (base component) 111, a main bearing 112, a rotary contact 113, a micro DC motor 114, a main gear 115, a main shaft 116, a transparent cover 117, and so forth. In the ranging module 60, the flexible substrate 18 on which the ranging elements 61 (not illustrated in FIG. 5) are disposed is disposed along the outer surface of the flexible base 111 with a spherical shape that somewhat collapses vertically in such a manner as to form longitude lines.

The micro DC motor 114 is fitted to the main gear 115. In response to driving of the micro DC motor 114, torque is transmitted to the main gear 115, and the constituent parts including the flexible substrate 18 in the ranging module 60 other than the main shaft 116 fitted to the main gear 115, the main gear 115, and the transparent cover 117 rotate around the main shaft 116. That is, while the micro DC motor 114 is generating the rotational torque, the micro DC motor 114 itself also rotates around the main shaft 116 integrally with other constituent parts. Note that the drive part (means) that rotationally drives the ranging module 60 is not limited to the micro DC motor 114 and may be any motor as long as it is a motor that generates torque, such as a frameless motor.

It suffices that the rotation structure is a structure using a standard bearing. It also suffices that opening and closing of the umbrella skeleton are implemented by a general link mechanism. Also regarding power feed, a standard power feed method with a brush or the like is sufficient. It suffices that detection of the position and phase of the base component that rotates, such as the flexible base 111, is carried out by what uses a general Hall element, or the like. Transmission of ranging data may be wired transmission using an electrode or the like or may be wireless transmission by TransferJet (registered trademark) or the like.

The movable ranging device that has already become publicly-known at present needs high-accuracy positioning of a light source, a sensor, and an optical part, and the high position accuracy needs to be kept for a long period of time in a severe environment. Furthermore, because the movable ranging device also needs to be made strong against vibrations, a massive and robust rotating body and a sturdy casing that supports the rotating body are necessary. Therefore, the movable ranging device has a large size and is heavy and expensive. Furthermore, it needs regular maintenance. In the technique of the present disclosure, the light emitting substrate 11 as the light source, the light receiving substrate 12 as the sensor, the lens 15 as the optical part, and so forth are integrated at the chip level. Therefore, positioning of them does not need to be carried out. That is, according to the technique of the present disclosure, the ranging device 10 in which the light emitting element 21, the light receiving element 22, and the lens 15 are integrated and the ranging module 60 can be provided with a simple structure. Therefore, a device that has small size and light weight, is inexpensive, and does not need maintenance can be implemented.

Furthermore, a scanning method based on not rotational scanning but reciprocation swing scanning, two-dimensional swing+rotatable hinge, or the like may be employed.

To implement ranging across a longer distance and enhancement in the accuracy of ranging, it is effective to raise the capture efficiency of radiated light. For this, setting the lens diameter large is an effective measure. However, in the present proposal, the lens 15 is formed at a semiconductor step base. Therefore, when the lens 15 is set large, the cost of the ranging element 61 (ranging device 10) becomes greatly high.

Figure 6:
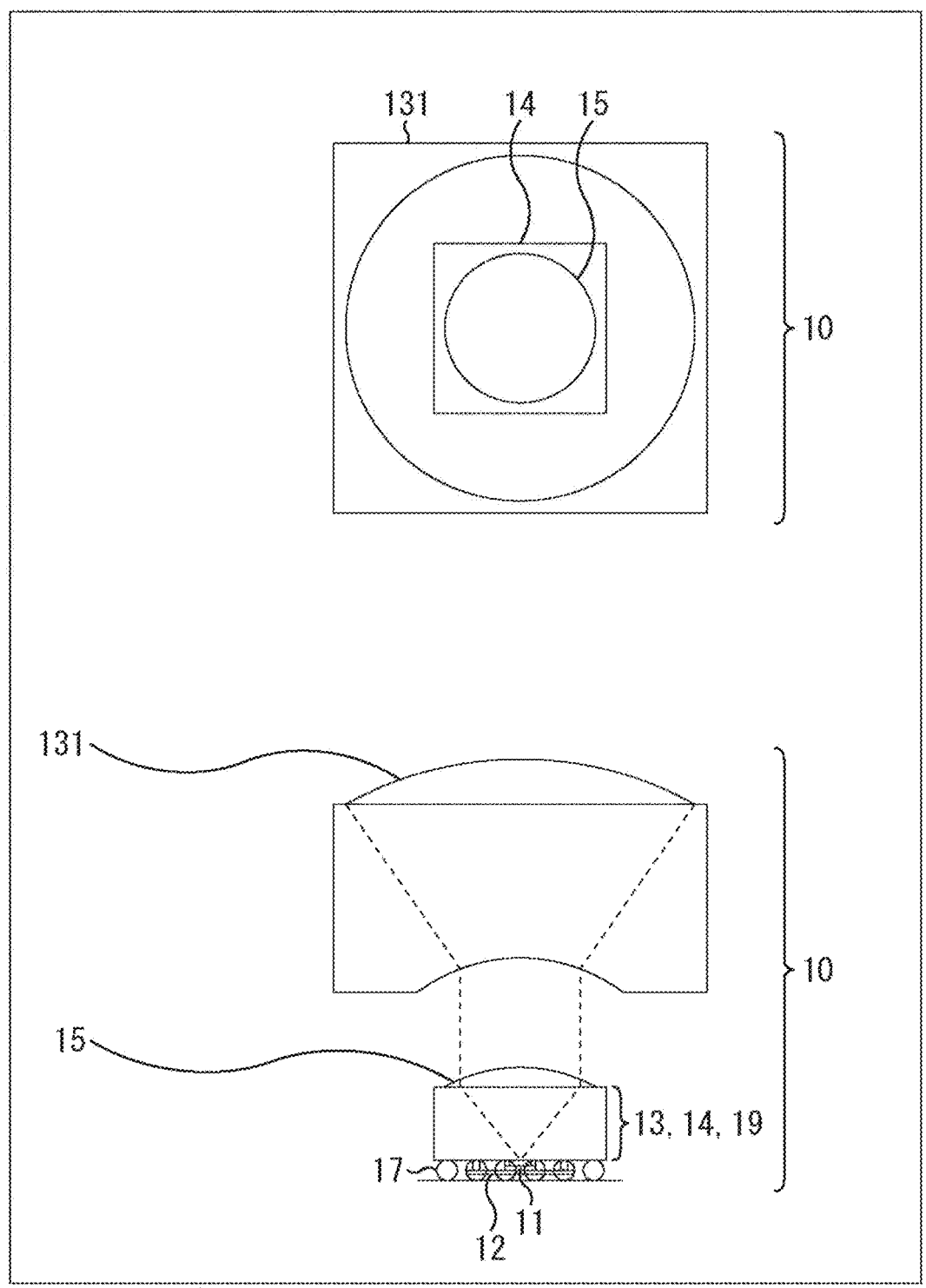
FIG. 6 is a sectional view illustrating a configuration example using two lenses in configuration examples of the ranging device to which the present technique is applied.

FIG. 6 includes a sectional view and a plan view illustrating a configuration example of a ranging device with a two-lens structure.

In the case of desiring prevention of cost increase, the ranging device 10 takes the two-lens structure as illustrated in FIG. 6, for example. In FIG. 6, an inexpensive resin-molded lens 131 is disposed above the ranging device 10. For example, suppose that the diameter of the resin-molded lens 131 is φ3.8 mm that is approximately twice the element (circuit substrate 13). Both lenses, i.e. the lens 15 and the resin-molded lens 131, are subjected to collimate-coupling by collimated light with φ1.2 mm, for example. Due to this, for example, even when axis misalignment of ±0.2 mm occurs between both lenses (lens 15 and resin-molded lens 131), the coupling efficiency hardly lowers, and stable ranging is allowed. Furthermore, in the ranging device 10 in which the resin-molded lens 131 is disposed, the apparent lens diameter becomes twice and therefore the light capture area that is approximately four times large can be ensured compared with the case in which the resin-molded lens 131 is not disposed.

In a ranging module having the ranging devices 10 of FIG. 6 as the ranging elements 61, a transparent cover is put on the outermost part and sealing is carried out in a form in which these optical systems (lens 15 and resin-molded lens 131) are completely covered. In the case of an omnidirectional style, a seamless transparent cover is necessary.

Figure 7:
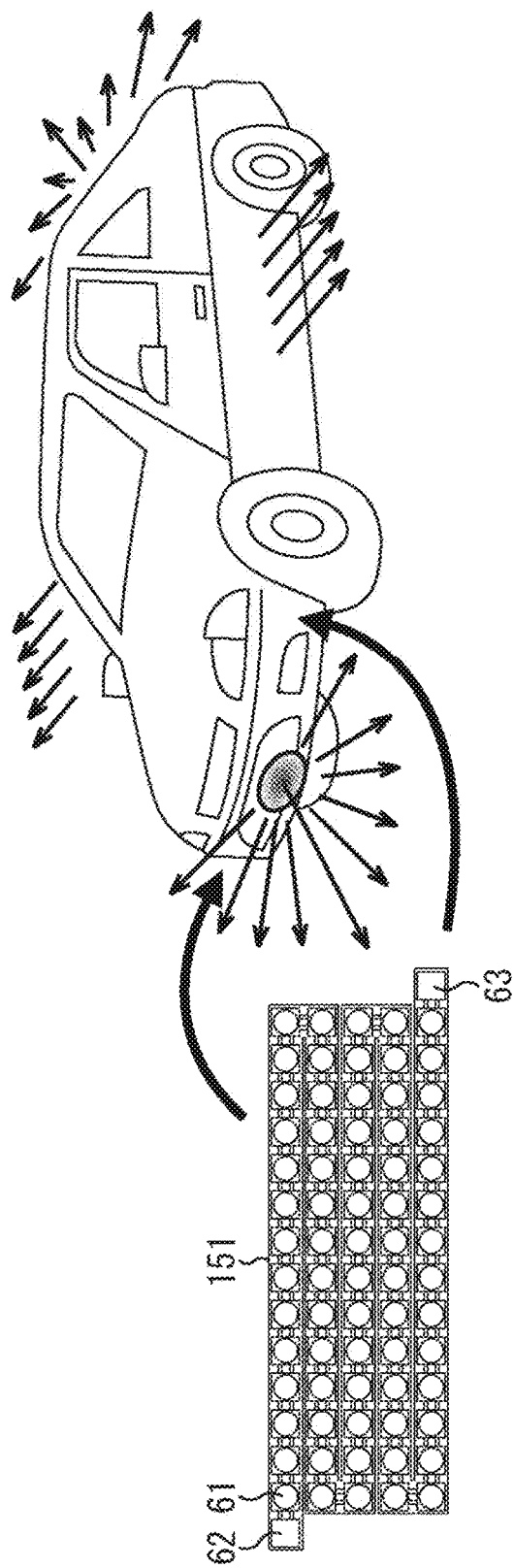
FIG. 7 is a diagram illustrating an application example of the ranging module to which the present technique is applied.

FIG. 7 is a diagram illustrating an application example of the ranging module to which the present technique is applied.

The ranging module configured with use of the ranging devices 10 has a structure in which minute light emitting-receiving elements (light emitting elements 21 and light receiving elements 22) are freely disposed and therefore can be allowed to have various forms as illustrated in FIG. 7.

The example of a light bulb type (lantern type) capable of omnidirectional ranging is depicted as a standard style thus far. When the base component to which the flexible substrate 18 is stuck is formed into a semispherical shape, the ranging module becomes a device of a dome type and has such a style as to be capable of ranging of semispherical directions. Furthermore, as illustrated in FIG. 7, when a ranging module in which a flexible substrate 151 on which plural ranging elements 61 are arranged in a lattice manner is stuck to a flat surface or a gently-curved surface is buried in a bumper or body of a car, the car body itself of the car can be turned to a sensor. Moreover, when a linear elongated flexible substrate is stuck to a shaft-shaped base component and is rotated, the ranging module becomes a line sensor type that is elongated and has a high definition. In addition, through sticking a flexible substrate to a wiper, wheel, tire, or the like of a car, a structure that carries out scanning by utilizing the movable structure of the car body itself can also be taken. When flexible substrates are put around a ceiling in a car at a low density, the ranging module can also be used as a sensor that detects the motion of passengers of a large-size route bus, and so forth. When a flexible substrate is made transparent and is stuck to a front, rear, or side glass, the ranging module can also be used as a ranging sensor having transparency. When what has flexibility is employed as the base component, the ranging module allowed to freely get deformed can also be implemented. Needless to say, when only one ranging element 61 is used, the ranging module also functions as a very-inexpensive one-point ranging module. As above, the technique of the present disclosure has very high design flexibility. As long as the ranging element 61 that serves as the base exists, it becomes possible to meet demands of various customers at low cost.

Figure 8:
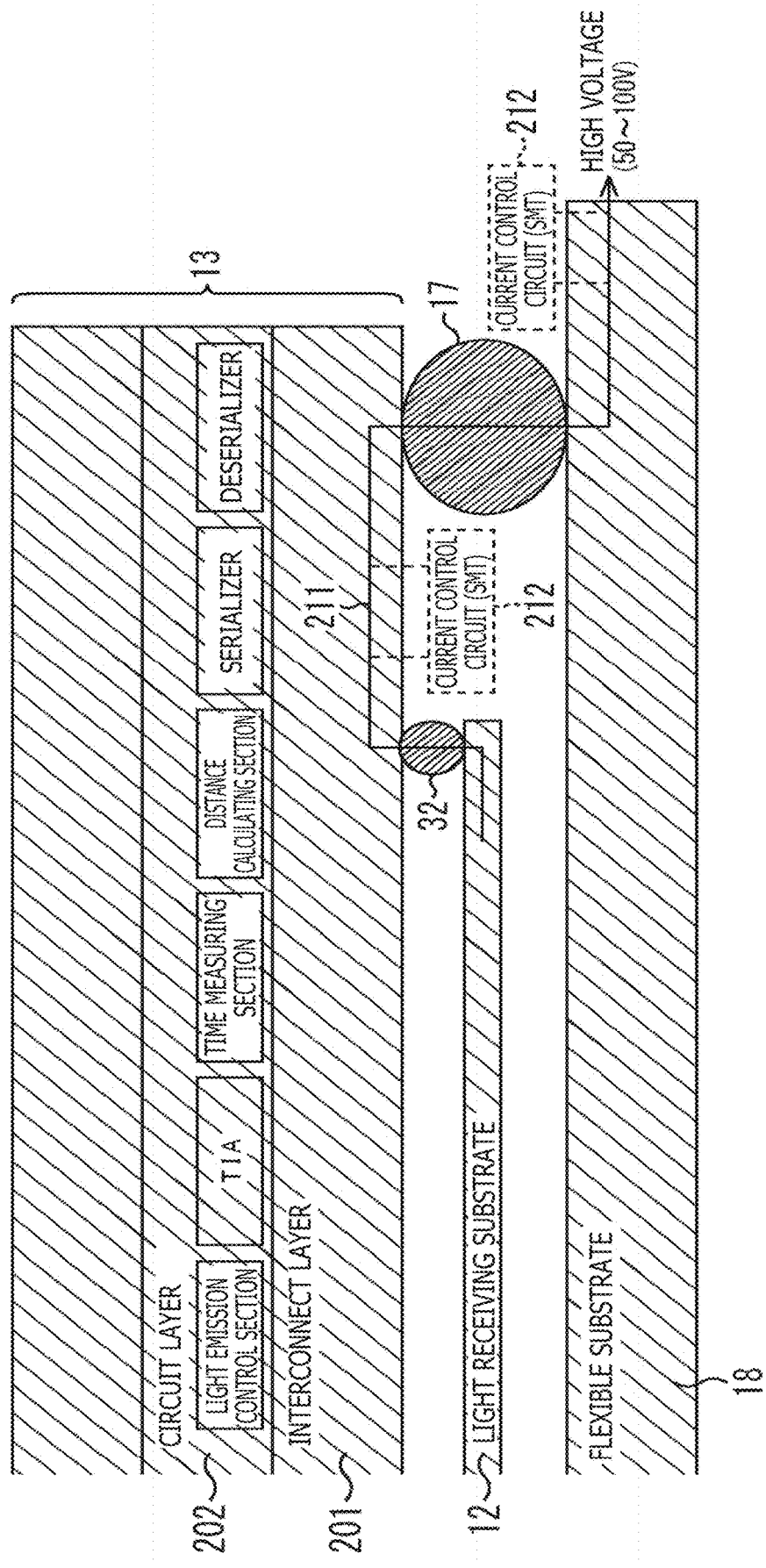
FIG. 8 is a sectional view illustrating a detailed configuration example of a circuit substrate 13.

FIG. 8 is a sectional view illustrating a detailed configuration example of the circuit substrate 13.

Here, the direction in which light (outgoing light) of the light emitting element 21 is emitted is referred to as upward (upper side).

The circuit substrate 13 has an interconnect layer 201 and a circuit layer 202. In the circuit substrate 13, the interconnect layer 201 is formed on the lower side, and the circuit layer 202 is formed on the upper side of the interconnect layer 201.

In the circuit layer 202, the light emission control section, the transimpedance amplifier (TIA), the time measuring section, the distance calculating section, the serializer, the deserializer, and so forth described with FIG. 1 are formed.

As described with FIG. 1, in the case of employing an APD or the like to which a high voltage needs to be applied as the light receiving element 22 (not illustrated in FIG. 8) of the light receiving substrate 12, it is possible to employ a structure in which the cathode of the APD is directly coupled to the solder bump 17 and the high voltage is directly guided from the external of the ranging device 10.

In this case, the cathode of the APD is connected to one of the plural second bumps 32 that connect the light receiving substrate 12 and the circuit substrate 13 and is connected from the one second bump 32 to one of the plural solder bumps 17 that connect the ranging device 10 and the flexible substrate 18 via only the interconnect layer 201 of the circuit substrate 13. Furthermore, the cathode of the APD is connected from the one solder bump 17 to the high voltage of the external of the ranging device 10.

The interconnect that connects the cathode of the APD and the high voltage in the above-described manner will be referred to as a cathode interconnect 211. At the part that passes through the interconnect layer 201 or the part that is extended from the solder bump 17 to the external of the ranging device 10 in the cathode interconnect 211, an SMT chip as a current control circuit 212 that controls the current flowing in the cathode interconnect 211, such as large-current cutoff, can be disposed. In the case of configuring the ranging module 60 by using plural ranging devices 10 (ranging elements 61 configured similarly thereto), the current control circuit 212 can be disposed for each ranging device 10 configuring the ranging module 60. Furthermore, the current control circuit 212 may be incorporated in the light receiving substrate 12 in the form of being formed between the light receiving element 22 and the second bump 32.

Figure 9:
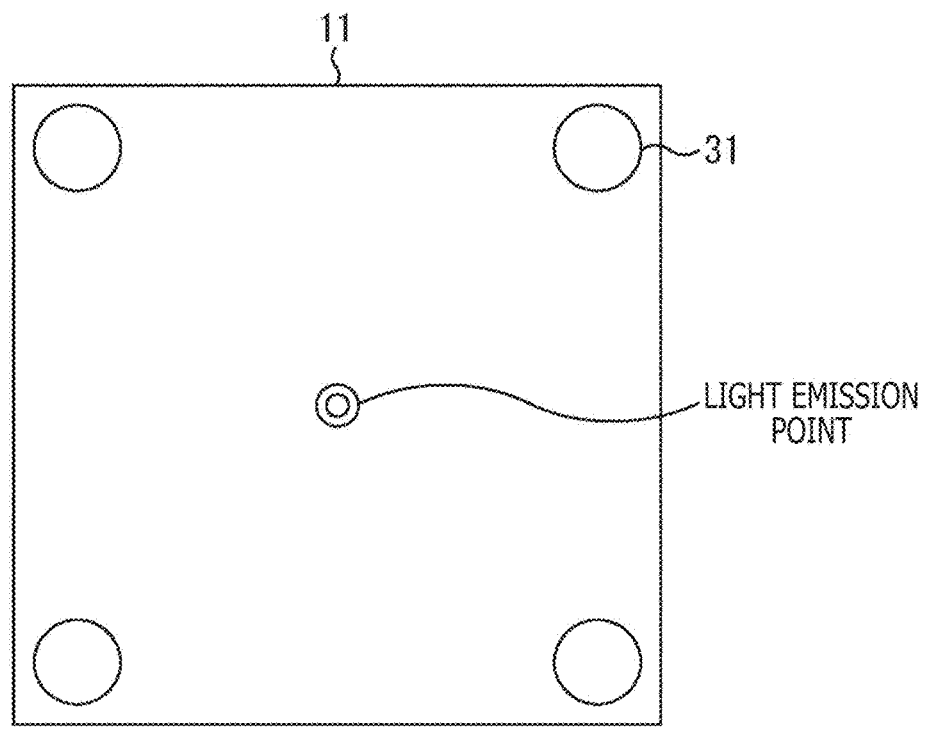
FIG. 9 is a plan view illustrating a first detailed configuration example of a light emitting substrate 11.

FIG. 9 is a plan view illustrating a first detailed configuration example of the light emitting substrate 11.

In FIG. 9, the light emitting substrate 11 (VCSEL) has one light emission point at the center (centroid). The light emission point has a size of φ10 um and a mesa structure. From the light emission point, a laser beam as radiated light is radiated (emitted) to the front side of the drawing. Note that, even when the light emitting substrate 11 is a back-surface radiation type with which a laser beam as radiated light is radiated to the back side of the drawing, the ranging device 10 can be configured through making contrivance on the mounting structure.

The first bumps 31 (solder bumps) with a size of φ40 um are disposed at four corners of the light emitting substrate 11 of FIG. 9.

Note that the sizes of the light emission point and the first bumps 31 are not limited to the above-described values and can be adjusted to proper values by optimization design.

Figure 10:
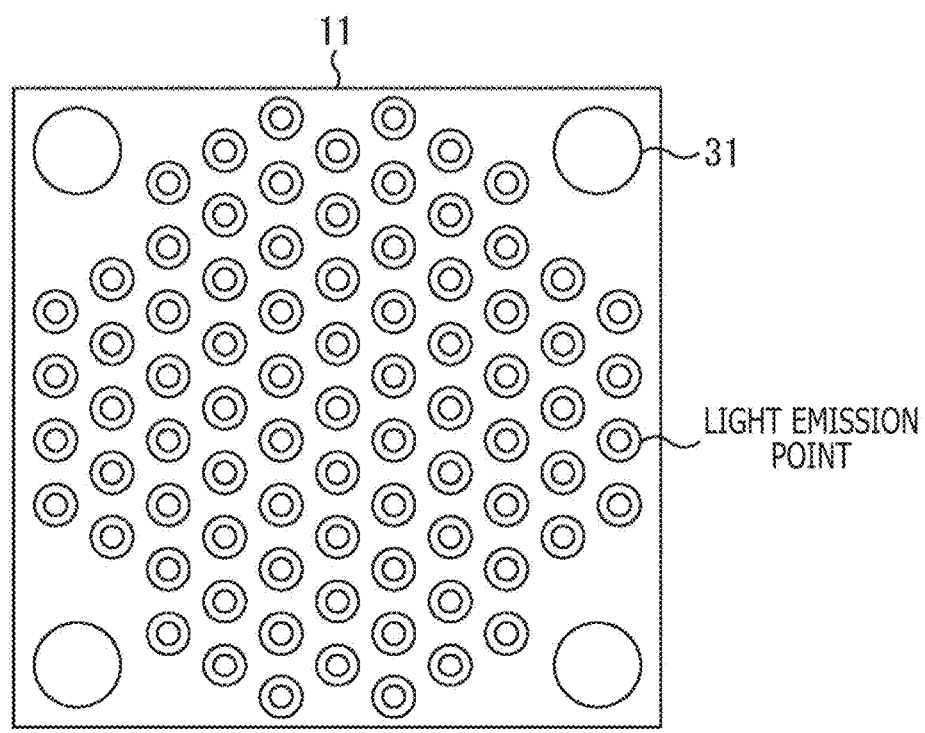
FIG. 10 is a plan view illustrating a second detailed configuration example of the light emitting substrate 11.

FIG. 10 is a plan view illustrating a second detailed configuration example of the light emitting substrate 11.

In FIG. 10, the light emitting substrate 11 has, for example, 81 light emission points as plural light emission points. The pitch between the light emission points is 30 um. The light emitting substrate 11 of FIG. 10 can be regarded as a surface light source having an area of approximately □300 um. In this case, a problem arises in some cases with the lens 15 of the above-described optical design, i.e. the lens 15 having the function as the collimating lens that converts radiated light of the light emitting substrate 11 to outgoing light of collimated light.

In the case in which the light emitting substrate 11 has plural light emission points as illustrated in FIG. 10, in the lens 15, radiated light emitted by the light emission point at the central part of the light emitting substrate 11 is converted to collimated light in the just-upward direction (optical axis direction), whereas radiated light emitted by the light emission point at the peripheral part of the light emitting substrate 11 is emitted in an oblique direction with respect to the just-upward direction.

For example, in the case in which the distance from the light emitting substrate 11 to the lens 15 is approximately 1 mm and a target of ranging is 100 m ahead, the amount of deviation at the target between the radiated light emitted by the light emission point at the central part of the light emitting substrate 11 and the radiated light emitted by the light emission point at the peripheral part becomes hundred thousand times the amount of offset between the light emission point at the central part and the light emission point at the peripheral part. Specifically, for example, radiated light (outgoing light) emitted by the light emission point laterally separate from the center (centroid) of the light emitting substrate 11 by 100 um is, around 100 m ahead, applied to a position deviated by 10 m from the irradiation position irradiated with radiated light emitted by the light emission point at the center.

Thus, the ranging device 10 can be configured through disposing a lens above the transparent substrate 14, i.e. at a position more separate from the light emitting substrate 11 than the lens 15, instead of the lens 15 or in addition to the lens 15.

Figure 11:
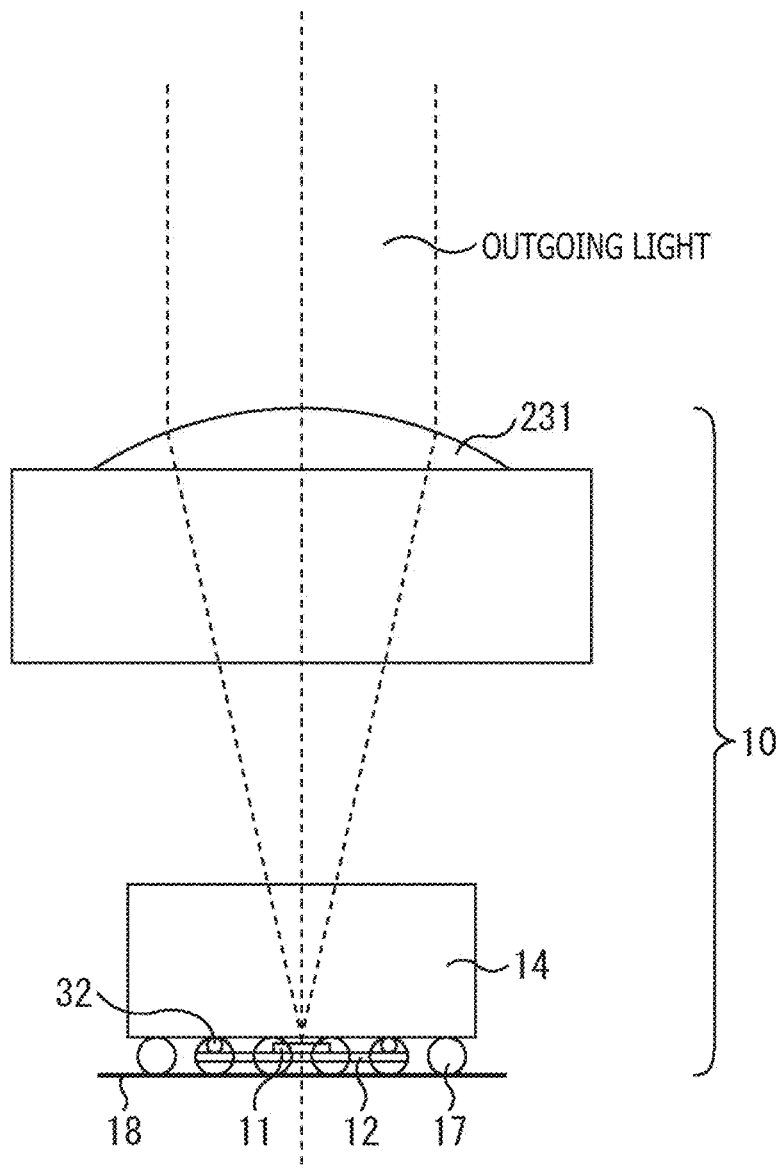
FIG. 11 is a sectional view illustrating a configuration example of a ranging device 10 in which a lens is disposed above a transparent substrate 14.

FIG. 11 is a sectional view illustrating a configuration example of the ranging device 10 in which a lens is disposed above the transparent substrate 14.

Note that, in the diagram, a part corresponding to the case of FIG. 1 is given the same reference sign and description thereof is omitted as appropriate in the following.

Furthermore, the circuit substrate 13 and the bonding layer 19 are extremely thin compared with the transparent substrate 14, and therefore diagrammatic representation thereof is omitted in FIG. 11. This applies also to diagrams to be described later.

In FIG. 11, instead of the lens 15, a lens 231 is disposed above the transparent substrate 14. For example, the lens 231 is disposed separately upward from the light emitting substrate 11 by 3 mm and in such a manner that the optical axis of the lens 231, the optical axis of the light emitting substrate 11 (light emitting element 21 thereof), and the center axis of the light receiving substrate 12 (light emitting element 21 thereof) are located on substantially the same axis.

As the material of the lens 231, glass, resin, or the like can be employed. Furthermore, although the lens 15 is not disposed in FIG. 11, the ranging device 10 can be configured through disposing the lens 15 besides the lens 231.

In the case in which the lens 231 is disposed separately upward from the light emitting substrate 11 by 3 mm as described above, the amount of deviation in the region that is 100 m ahead regarding the radiated light emitted by the light emission point laterally separate from the center of the light emitting substrate 11 by 100 um can be reduced from the above-described 10 m to approximately 3 m.

Note that, in the ranging device 10 of FIG. 11, the resin-molded lens 131 as a collecting lens that has a larger diameter than the lens 231 and is collimate-coupled to the lens 231 can be disposed above the lens 231 similarly to the case of FIG. 6. In the case of disposing the resin-molded lens 131, the size of the lens 231 can be suppressed and the cost can be suppressed.

Through disposing plural lenses in the ranging device 10 as described with FIG. 6 and FIG. 11 (moreover, as described with diagrams to be described later), ranging with high accuracy can be carried out regarding long distance.

In the case of disposing plural lenses in the ranging device 10, different materials can be employed as the materials of the plural lenses. As the materials of the lenses, for example, glass, synthetic quartz, resin, acryl, and so forth can be employed.

Figure 12:
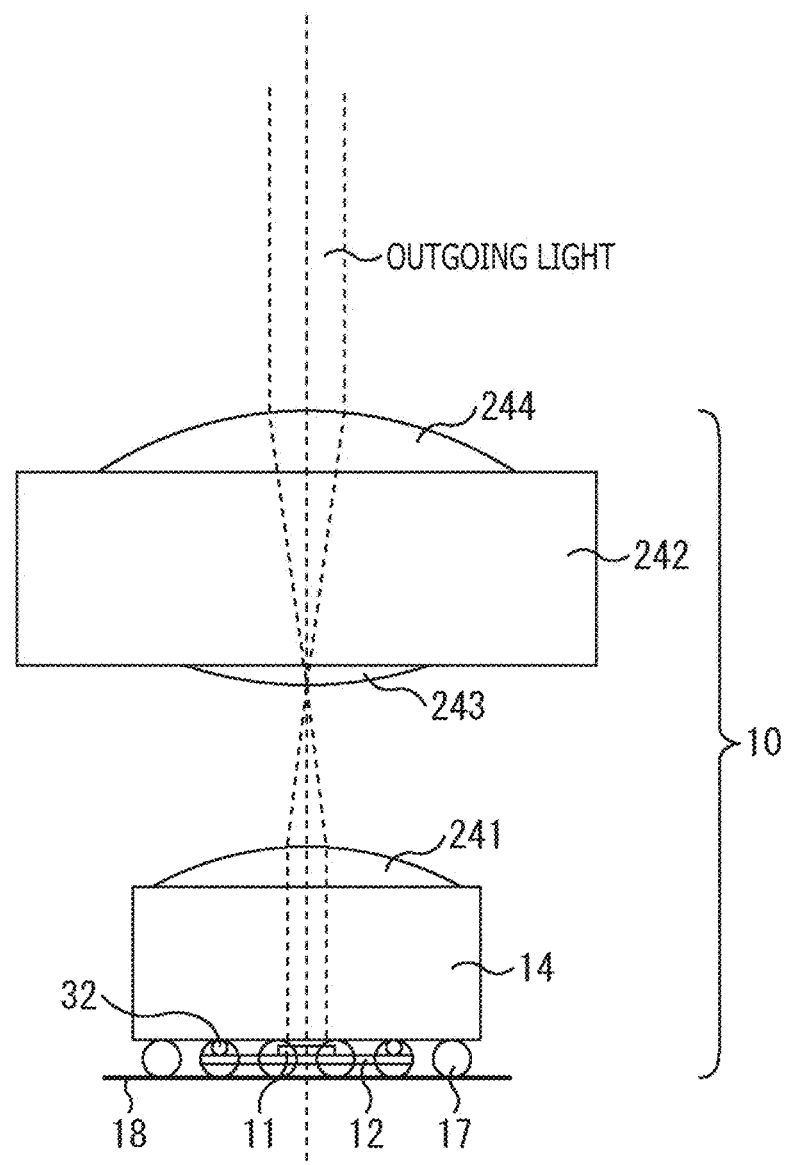
FIG. 12 is a sectional view illustrating a configuration example of the ranging device 10 of a three-lens configuration.

FIG. 12 is a sectional view illustrating a configuration example of the ranging device 10 of a three-lens configuration having three lenses as plural lenses.

Note that, in the diagram, a part corresponding to the case of FIG. 1 is given the same reference sign and description thereof is omitted as appropriate in the following.

In FIG. 12, a lens 241 is formed on the upper part of the transparent substrate 14. Moreover, in FIG. 12, a lens substrate 242 is disposed above the transparent substrate 14, and lenses 243 and 244 are formed on the lower part and the upper part of the lens substrate 242, respectively.

The lenses 241, 243, and 244 are disposed in such a manner that the optical axes of the lenses 241, 243, and 244, the optical axis of the light emitting substrate 11, and the center axis of the light receiving substrate 12 are located on substantially the same axis.

The lens substrate 242, thus the lenses 243 and 244, can be disposed separately upward from the light emitting substrate 11 by several millimeters, for example.

In FIG. 12, the lens 241 collects outgoing light (radiated light) of the light emitting substrate 11 in such a manner that the outgoing light goes toward the optical axis, and the lens 243 orients the outgoing light that goes toward the optical axis into the just-upward direction. Furthermore, the lens 244 converts the diffuse component of the outgoing light oriented into the just-upward direction by the lens 243 to collimated light. Due to this, in principle, the outgoing light emitted by the plural light emission points of the light emitting substrate 11 can be treated as light emitted from one point on the center axis. That is, the lens 243 can be regarded as a light source that emits light obtained by collecting the outgoing light emitted by the plural light emission points of the light emitting substrate 11.

Note that the roles of the above-described lenses 241, 243, and 244 are merely one example and it is possible to carry out optical design that causes the lenses 241, 243, and 244 to have other roles that are completely different.

Furthermore, the lens substrate 242 on which the lenses 243 and 244 are formed can be formed into a structure in which leg parts in which the transparent substrate 14 on which the lens 241 is formed and the parts under the transparent substrate 14 in the ranging device 10 are housed are disposed at the periphery of the lens substrate 242. In addition, the lenses 243 and 244 formed on the lens substrate 242 can be fixed over the flexible substrate 18 by putting the lens substrate 242 in such a manner that the transparent substrate 14 and the parts under the transparent substrate 14 in the ranging device 10 are housed therein and bonding the leg parts to the flexible substrate 18, which is an organic substrate, or the like. This also applies to the lens 231 in FIG. 11.

Figure 13:
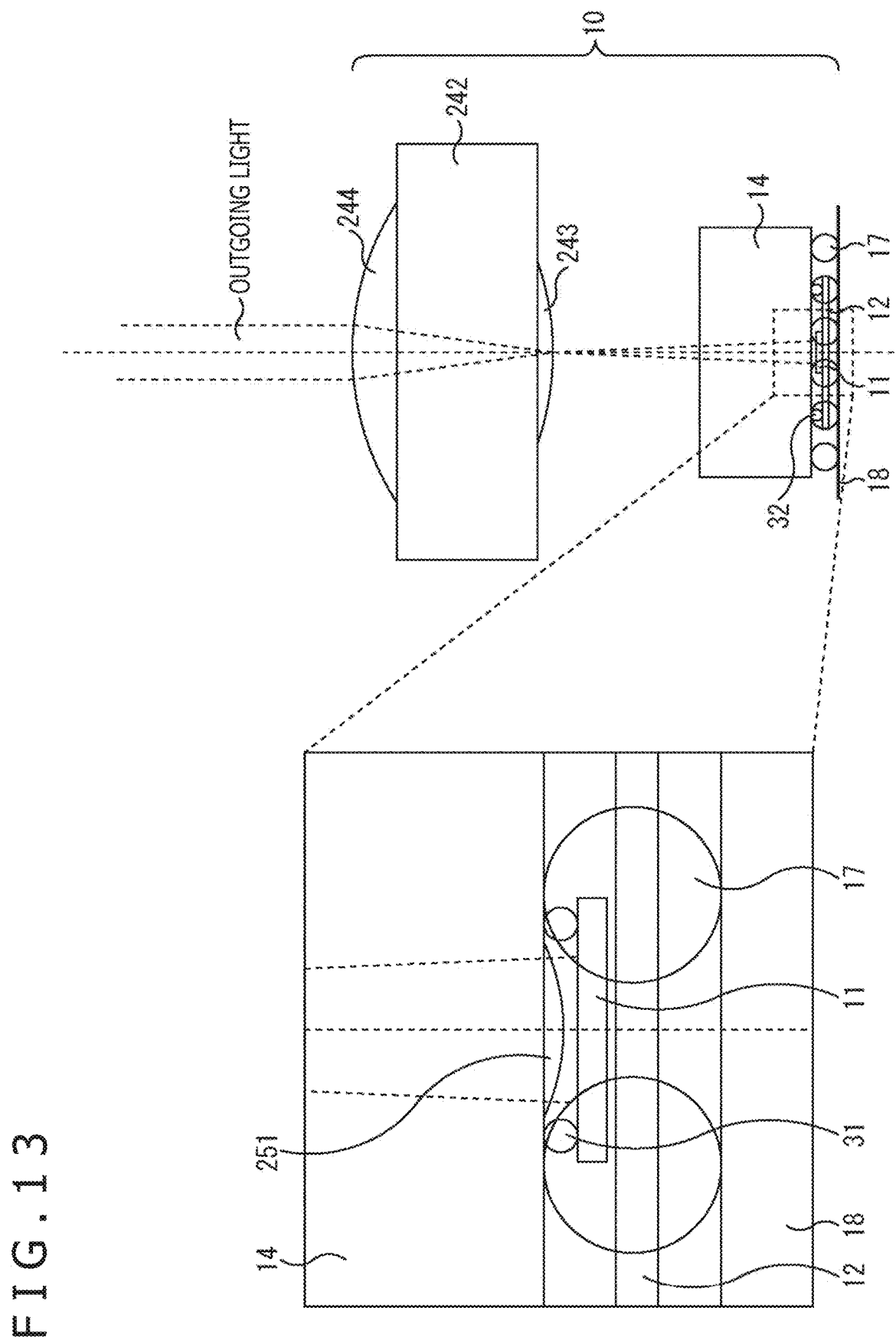
FIG. 13 is a sectional view illustrating another configuration example of the ranging device 10 of the three-lens configuration.

FIG. 13 is a sectional view illustrating another configuration example of the ranging device 10 of the three-lens configuration.

Note that, in the diagram, a part corresponding to the case of FIG. 12 is given the same reference sign and description thereof is omitted as appropriate in the following.

In FIG. 13, a lens 251 formed on the lower part of the transparent substrate 14 (on the side of the light emitting substrate 11) is disposed instead of the lens 241 formed on the upper part of the transparent substrate 14 in FIG. 12.

The lens 251 is formed at the part of the opening part 41 (FIG. 1), which is not illustrated in FIG. 13, in such a manner that the optical axis of the lens 251, the optical axis of the light emitting substrate 11, and the center axis of the light receiving substrate 12 are located on substantially the same axis.

Figure 14:
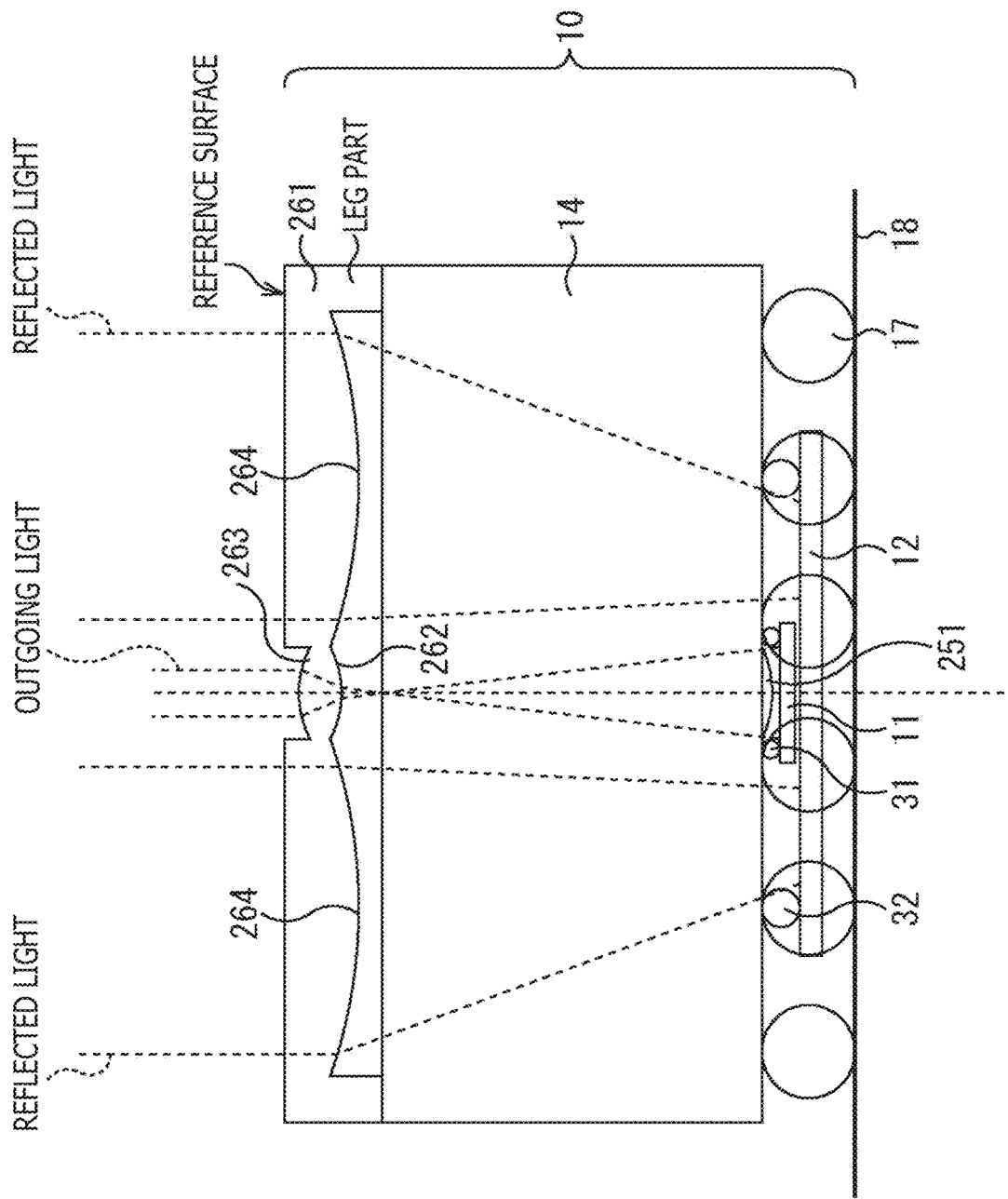
FIG. 14 is a sectional view illustrating further another configuration example of the ranging device 10 of the three-lens configuration.

FIG. 14 is a sectional view illustrating further another configuration example of the ranging device 10 of the three-lens configuration.

Note that, in the diagram, a part corresponding to FIG. 13 is given the same reference sign and description thereof is omitted as appropriate in the following.

In FIG. 14, a lens substrate 261 is disposed instead of the lens substrate 242 in FIG. 13 (and the lenses 243 and 244 formed on the lens substrate 242).

In the ranging device 10 of FIG. 14, the lens substrate 261 is stacked on the upper side of the transparent substrate 14 (lens substrate) on which the lens 251 is formed. Specifically, leg parts are formed at the peripheral part of the lens substrate 261, and the leg parts are bonded to the transparent substrate 14. Thereby, the transparent substrate 14 and the lens substrate 261 are stacked. Note that the ranging device 10 can be configured by stacking three or more lens substrates on which lenses are formed besides the transparent substrate 14 and the lens substrate 261 as two lens substrates.

In the lens substrate 261, a lens 262 is formed at the lower part of the central part, and a lens 263 is formed at the upper part of the central part. Moreover, a lens 264 with a doughnut shape in plan view is formed at the lower part of the peripheral part outside the lens 262 in the lens substrate 261.

The lens substrate 261 in which the lenses 262 to 264 are formed is disposed in such a manner that the optical axis of each of the lenses 262 to 264, the optical axis of the light emitting substrate 11, and the center axis of the light receiving substrate 12 are located on substantially the same axis.

The lens 263 is formed in such a manner as to be offset from the upper surface of the lens substrate 261 as a reference surface to a recess position (position on the lower side). Due to this, the uppermost lens substrate 261 in the transparent substrate 14 and the lens substrate 261 as the plural stacked lens substrates in the ranging device 10 is formed into a structure that does not have a convex part that protrudes upward from the upper surface.

In the ranging device 10 of FIG. 14, the uppermost lens substrate 261 has a structure that does not have a convex part that protrudes upward from the upper surface and in which the upper surface is almost flat. Therefore, at the time of manufacturing of the ranging device 10 or a device including the ranging device 10 as a constituent part, the upper surface of the lens substrate 261 can be easily sucked and held by a vacuum chuck, and the ranging device 10 can be easily conveyed.

Furthermore, in the ranging device 10 of FIG. 14, outgoing light emitted by the light emitting substrate 11 is output to a target of ranging through the lenses 251, 262, and 263. Moreover, reflected light obtained through reflection of the outgoing light by the target is collected onto the light receiving substrate 12 by the lens 264 and is received. Therefore, according to the lens 264, the reflected light that impinges on the light emitting substrate 11 and is lost can be reduced, and the light reception efficiency of the reception of the reflected light by the light receiving substrate 12 can be improved.

Here, for example, a microlens of approximately (30 um can be disposed at each light emission point of the light emitting substrate 11. By disposing the microlens at the light emission point, the radiation angle of radiated light emitted by the light emission point can be made small just above the light emission point, and the collection performance of the radiated light can be improved. However, in disposing the microlens, forming the microlens into a precise shape and precise positioning of the microlens are necessary.

Furthermore, in the ranging devices 10 of FIGS. 12 to 14, similarly to the case of FIG. 6, above the uppermost lens, the resin-molded lens 131 as a collecting lens that has a larger diameter than the lens 231, 244, or 263 and is collimate-coupled to the lens can be disposed. In the case of disposing the resin-molded lens 131, the size of the lens 231, 244, or 263 can be suppressed and the cost can be suppressed. In addition, ranging with high efficiency can be carried out.

Note that the present technique can employ the following configurations.

<1>

A ranging device including:
  a lens;
  a circuit substrate;
  a light emitting substrate having a light emitting element; and
  a light receiving substrate having a single light receiving element or light receiving elements that are two-dimensionally disposed, in which
  the light emitting substrate is connected to the circuit substrate through first bumps,
  the light receiving substrate is connected to the circuit substrate through second bumps, and
  an optical axis of the lens, an optical axis of the light emitting element, and a center axis of the light receiving element are disposed on substantially a same axis.

<2>

The ranging device according to <1>, in which
  the circuit substrate, the light emitting substrate, and the light receiving substrate are disposed in order of the circuit substrate, the light emitting substrate, and the light receiving substrate with respect to the lens, and a light reception area of the light receiving element is larger than a light emission area of the light emitting element.

<3>
The ranging device according to <1> or <2>, in which the circuit substrate has a first opening part between the light emitting element and the lens.

<4>
The ranging device according to any of <1> to <3>, in which
the circuit substrate has a second opening part between the light receiving element and the lens.

<5>
The ranging device according to any of <1> to <4>, in which
the lens is disposed on a lens substrate, and
the lens substrate is stacked over the circuit substrate.

<6>
The ranging device according to any of <1> to <5>, in which
the light receiving element includes an APD (avalanche photodiode) or a SPAD (single-photon avalanche diode).

<7>
The ranging device according to any of <1> to <6>, in which
the circuit substrate has a light emission control section that controls the light emitting element.

<8>
The ranging device according to any of <1> to <7>, in which
the circuit substrate has a time measuring section that measures a period of time from irradiation with light by the light emitting element to reception of the light by the light receiving element.

<9>
The ranging device according to <8>, in which
the circuit substrate has a distance calculating section that calculates a distance to an object irradiated with the light on the basis of the period of time measured by the time measuring section.

<10>
A ranging module including:
the ranging device according to any of <1> to <9>.

<11>
The ranging module according to <10>, further including:
a flexible substrate on which a plurality of the ranging devices is mounted.

<12>
The ranging module according to <11>, in which
the flexible substrate is formed into a lantern shape.

<13>
The ranging module according to <11> or <12>, further including:
a drive part that rotates the flexible substrate.

<14>
The ranging module according to <13>, further including:
a gear fitted to the drive part; and
a main shaft fitted to the gear, in which
the drive part rotates around the main shaft together with the flexible substrate by generating rotational torque.

<15>
The ranging module according to any of <10> to <14>, further including:
a transparent cover that covers the ranging device.

<16>
The ranging device according to any of <1> to <9>, in which
the lens includes a plurality of lenses.

<17>
The ranging device according to <16>, in which
materials of the plurality of lenses are different.

<18>
The ranging device according to <16> or <17>, in which
the plurality of lenses is formed through stacking of a plurality of lens substrates on which the lenses are formed.

<19>
The ranging device according to any of <16> to <18>, in which
a lens with a doughnut shape as one of the plurality of lenses is provided.

<20>
The ranging device according to any of <16> to <19>, in which
a direction in which light of the light emitting element is emitted is defined as an upward direction, and
an uppermost lens substrate in the plurality of lens substrates does not have a convex part that protrudes in the upward direction from an upper surface.

<21>
The ranging device according to any of <1> to <9> or any of <16> to <20>, in which
a direction in which light of the light emitting element is emitted is defined as an upward direction, and
the ranging device further includes a collecting lens with a larger diameter than the lens on a side of the upward direction relative to the lens.

<22>
The ranging device according to <21>, in which
the ranging device is configured in such a manner that the collecting lens and the lens are coupled by collimated light.

<23>
The ranging device according to any of <1> to <9> or any of <16> to <22>, in which
the lens is fixed onto an organic substrate.

<24>
The ranging device according to any of <1> to <9> or any of <16> to <23>, in which
the circuit substrate has a circuit layer and an interconnect layer, and
an interconnect that applies a voltage to the light receiving element passes through only the interconnect layer regarding the circuit substrate.

<25>
The ranging device according to <24>, further including:
a current control circuit that controls a current that flows in the interconnect.

REFERENCE SIGNS LIST

10 Ranging device, 11 Light emitting substrate, 12 Light receiving substrate, 13 Circuit substrate, 14 Transparent substrate, 15 Lens, 17 Solder bump, 18 Flexible substrate, 19 Bonding layer, 21 Light emitting element, 22 Light receiving element, 31, 32 Bump, 41, 42 Opening part, 60 Ranging module, 61 Ranging element, 62 Control element, 63 Interface element, 65 Connecting line, 111 Flexible base, 112 Main bearing, 113 Rotary contact, 114 Micro DC motor, 115 Main gear, 116 Main shaft, 117 Transparent cover, 131 Resin-molded lens, 151 Flexible substrate, 201 Interconnect layer, 202 Circuit layer, 211 Cathode interconnect, 212 Current control circuit, 231, 241 Lens, 242 Lens substrate, 243, 244, 251 Lens, 261 Lens substrate, 262 to 264 Lens

What is claimed is:

1. A ranging device, comprising:
   a lens;
   a circuit substrate;
   a light emitting substrate having a light emitting element; and
   a light receiving substrate having a single light receiving element or light receiving elements that are two-dimensionally disposed,
   wherein the light emitting substrate is connected to the circuit substrate through first bumps,
   wherein the light receiving substrate is connected to the circuit substrate through second bumps,
   wherein an optical axis of the lens, an optical axis of the light emitting element, and a center axis of the light receiving element are disposed on substantially a same axis, and
   wherein the circuit substrate has a first opening part between the light emitting element and the lens.

2. The ranging device according to claim 1, wherein
   the circuit substrate, the light emitting substrate, and the light receiving substrate are disposed in order of the circuit substrate, the light emitting substrate, and the light receiving substrate with respect to the lens, and
   a light reception area of the light receiving element is larger than a light emission area of the light emitting element.

3. The ranging device according to claim 1, wherein the circuit substrate has a second opening part between the light receiving element and the lens.

4. The ranging device according to claim 1, wherein the lens is disposed on a lens substrate, and
   wherein the lens substrate is stacked over the circuit substrate.

5. The ranging device according to claim 1, wherein the light receiving element includes an APD (avalanche photodiode) or a SPAD (single-photon avalanche diode).

6. A ranging module comprising:
   the ranging device according to claim 1.

7. The ranging device according to claim 1, wherein the lens includes a plurality of lenses.

8. The ranging device according to claim 7, wherein materials of the plurality of lenses are different.

9. The ranging device according to claim 7, wherein
   the plurality of lenses is formed through stacking of a plurality of lens substrates on which the lenses are formed.

10. The ranging device according to claim 9, wherein
    a direction in which light of the light emitting element is emitted is defined as an upward direction, and
    an uppermost lens substrate in the plurality of lens substrates does not have a convex part that protrudes in the upward direction from an upper surface.

11. The ranging device according to claim 7, wherein
    a lens with a doughnut shape as one of the plurality of lenses is provided.

12. The ranging device according to claim 1, wherein a direction in which light of the light emitting element is emitted is defined as an upward direction, and
    wherein the ranging device further includes a collecting lens with a larger diameter than the lens on a side of the upward direction relative to the lens.

13. The ranging device according to claim 12, wherein
    the ranging device is configured in such a manner that the collecting lens and the lens are coupled by collimated light.

14. The ranging device according to claim 1, wherein the circuit substrate has a circuit layer and an interconnect layer, and
    wherein an interconnect that applies a voltage to the light receiving element passes through the interconnect layer.

15. The ranging device according to claim 14, further comprising:
    a current control circuit that controls a current that flows in the interconnect.

16. A ranging device, comprising:
    a lens;
    a circuit substrate;
    a light emitting substrate having a light emitting element; and
    a light receiving substrate having a single light receiving element or light receiving elements that are two-dimensionally disposed,
    wherein the light emitting substrate is connected to the circuit substrate through first bumps,
    wherein the light receiving substrate is connected to the circuit substrate through second bumps, and
    wherein an optical axis of the lens, an optical axis of the light emitting element, and a center axis of the light receiving element are disposed on substantially a same axis, and
    wherein the circuit substrate has a light emission control section that controls the light emitting element.

17. A ranging device, comprising:
    a lens;
    a circuit substrate;
    a light emitting substrate having a light emitting element; and
    a light receiving substrate having a single light receiving element or light receiving elements that are two-dimensionally disposed,
    wherein the light emitting substrate is connected to the circuit substrate through first bumps,
    wherein the light receiving substrate is connected to the circuit substrate through second bumps, and
    wherein an optical axis of the lens, an optical axis of the light emitting element, and a center axis of the light receiving element are disposed on substantially a same axis, and
    wherein the circuit substrate has a time measuring section that measures a period of time from irradiation with light by the light emitting element to reception of the light by the light receiving element.

18. The ranging device according to claim 17, wherein
    the circuit substrate has a distance calculating section that calculates a distance to an object irradiated with the light on a basis of the period of time measured by the time measuring section.

19. A ranging module, comprising:
    a plurality of ranging devices, each ranging device in the plurality of ranging devices including:
    a lens;
    a circuit substrate;
    a light emitting substrate having a light emitting element; and
    a light receiving substrate having a single light receiving element or light receiving elements that are two-dimensionally disposed, wherein the light emitting substrate is connected to the circuit substrate through first bumps, wherein the light receiving substrate is connected to the circuit substrate through second bumps, and wherein an optical axis of the lens, an optical axis of the light emitting element, and a center axis of the light receiving element are disposed on substantially a same axis; and a flexible substrate on which a plurality of the ranging devices is mounted.

20. The ranging module according to claim 19, wherein the flexible substrate is formed into a lantern shape.

21. The ranging module according to claim 19, further comprising:

a drive part that rotates the flexible substrate.

22. The ranging module according to claim 21, further comprising:

a gear fitted to the drive part; and a main shaft fitted to the gear, wherein the drive part rotates around the main shaft together with the flexible substrate by generating rotational torque.

23. The ranging module according to claim 19, further comprising:

a transparent cover that covers the ranging device.

24. A ranging device, comprising:

a lens;

a circuit substrate;

a light emitting substrate having a light emitting element; and a light receiving substrate having a single light receiving element or light receiving elements that are two-dimensionally disposed, wherein the light emitting substrate is connected to the circuit substrate through first bumps, wherein the light receiving substrate is connected to the circuit substrate through second bumps, wherein an optical axis of the lens, an optical axis of the light emitting element, and a center axis of the light receiving element are disposed on substantially a same axis, and wherein the lens is fixed onto an organic substrate.

* * * * *